United States Patent [19]

Namose

[11] Patent Number: 5,173,151

[45] Date of Patent: Dec. 22, 1992

[54] METHOD OF DRY ETCHING IN SEMICONDUCTOR DEVICE PROCESSING

[75] Inventor: Isamu Namose, Suwa, Japan

[73] Assignee: Seiko Epson Corporation, Tokyo, Japan

[21] Appl. No.: 736,855

[22] Filed: Jul. 29, 1991

[30] Foreign Application Priority Data

Jul. 30, 1990 [JP] Japan .................................. 2-201811
Apr. 5, 1991 [JP] Japan .................................. 3-72811

[51] Int. Cl.$^5$ ........................ B44C 1/22; C03C 15/00; C03C 25/06
[52] U.S. Cl. .................................. 156/643; 156/657; 252/79.1
[58] Field of Search ............... 156/643, 646, 650, 653, 156/657, 659.1, 662; 204/192.32, 192.37; 437/228, 238; 252/79.1

[56] References Cited

U.S. PATENT DOCUMENTS

| | | | |
|---|---|---|---|
| 4,226,665 | 10/1980 | Mogab | 156/643 |
| 4,547,260 | 10/1985 | Takada et al. | 156/643 |
| 4,676,867 | 6/1987 | Elkins et al. | 156/643 |

FOREIGN PATENT DOCUMENTS

| | | |
|---|---|---|
| 243273 | 4/1986 | European Pat. Off. |
| 249173 | 12/1987 | European Pat. Off. |
| 284124 | 9/1988 | European Pat. Off. |
| 368504 | 5/1990 | European Pat. Off. |
| 386337 | 9/1990 | European Pat. Off. |
| 48140 | 5/1981 | Japan. |

*Primary Examiner*—William A. Powell
*Attorney, Agent, or Firm*—W. Douglas Carothers, Jr.

[57] ABSTRACT

A dry chemical etching method for etching one or more silicon oxide layers, such as SOG, TEOS, LTO or other types of deposited Si or SiO$_2$ layers, provides for low selectivity (ratio) with high controllability and reliability with shorter etching times and increased wafer throughput and yield. The etching medium comprises $C_nF_{2n+2}$, wherein n is an integer, such as, CF$_4$, C$_2$F$_6$ or C$_3$F$_8$, and an inert gas, such as, He, Ar or Xe. The inert gas as properly mixed with the fluoride gas provides a buffering effect on the fluorine radicals, F*, liberated in the plasma, so that control over the uniformity and the rate of etching can more easily be accomplished without fear of nonuniform etching or over-etching.

10 Claims, 7 Drawing Sheets

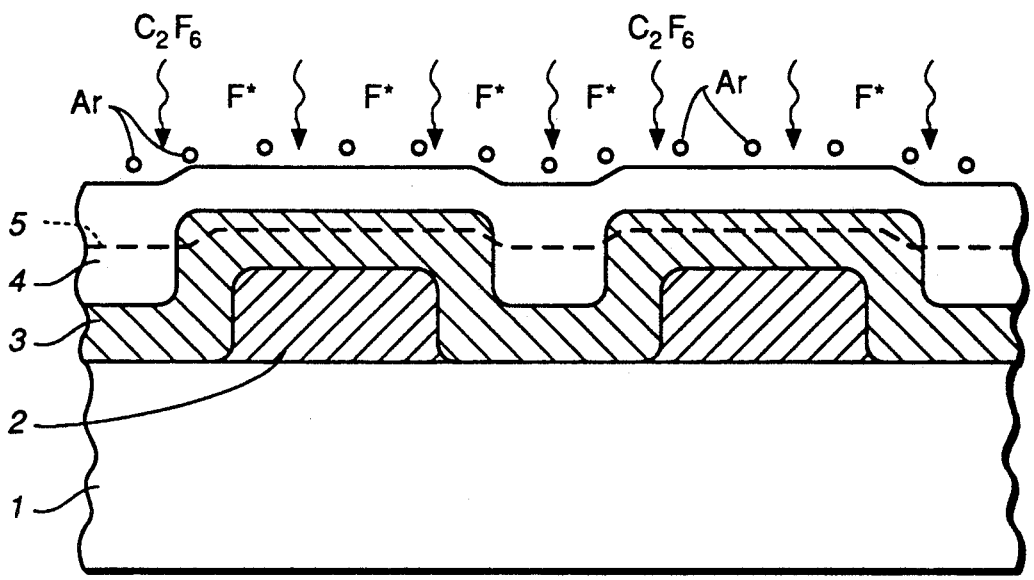
FIG._1
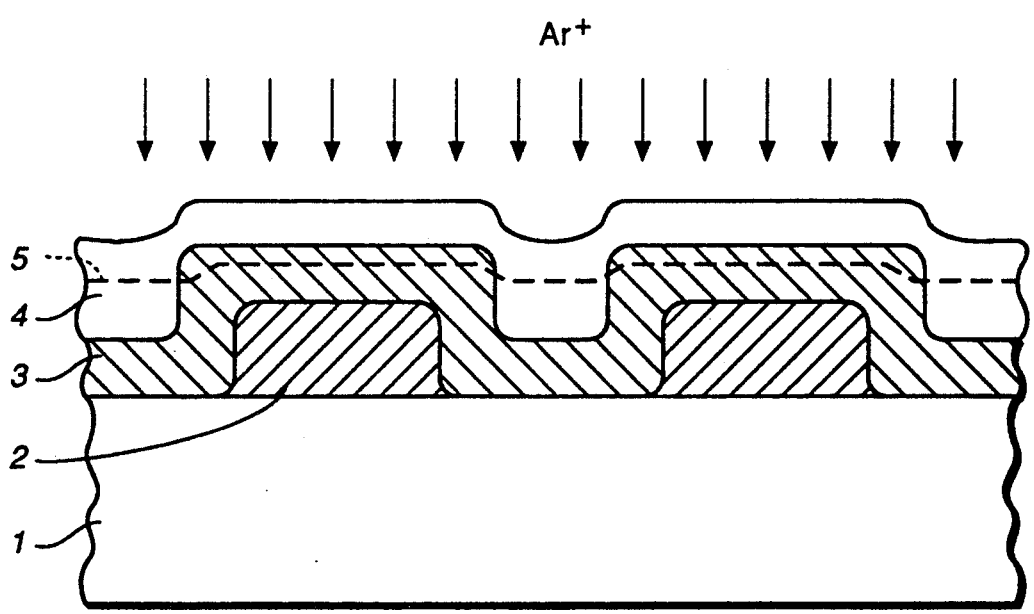
FIG._8
*(PRIOR ART)*

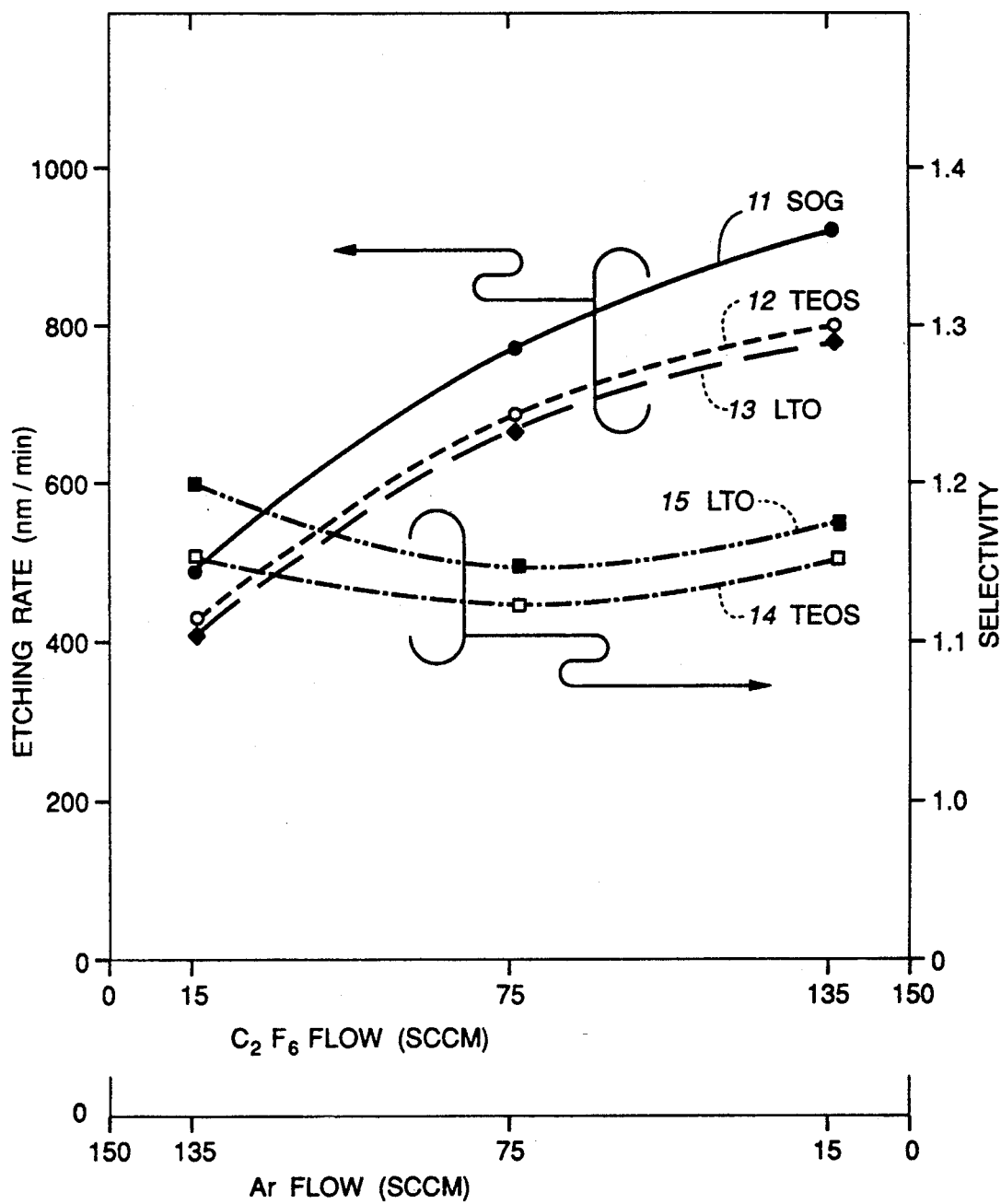
FIG._2

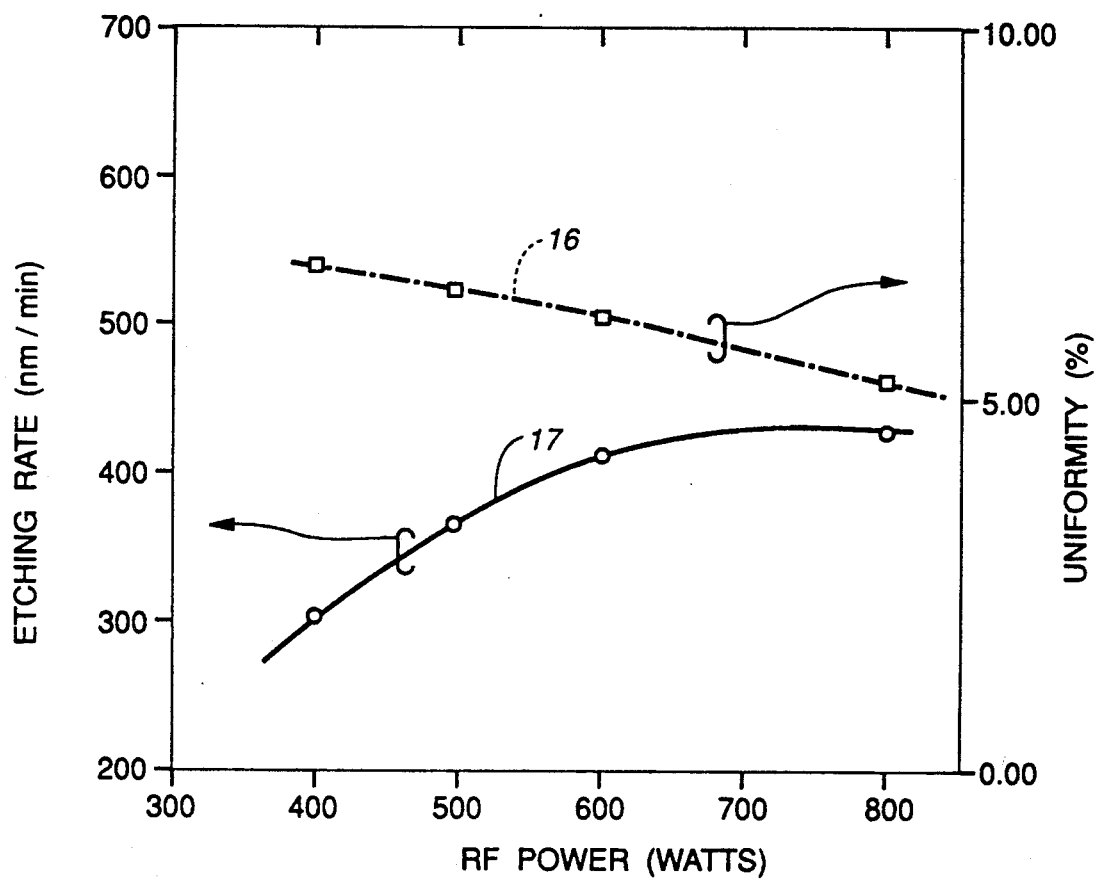
FIG._3

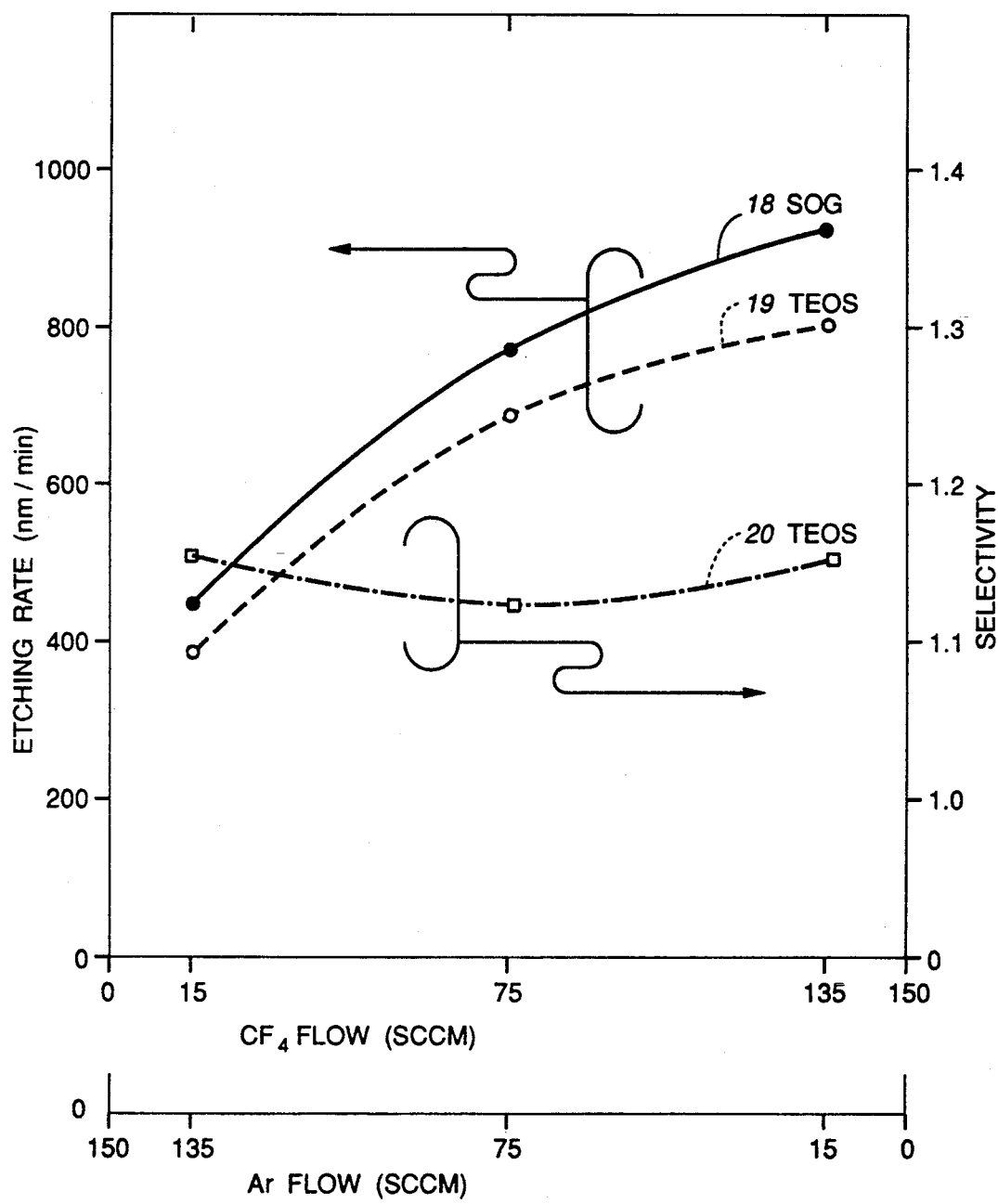
FIG._4

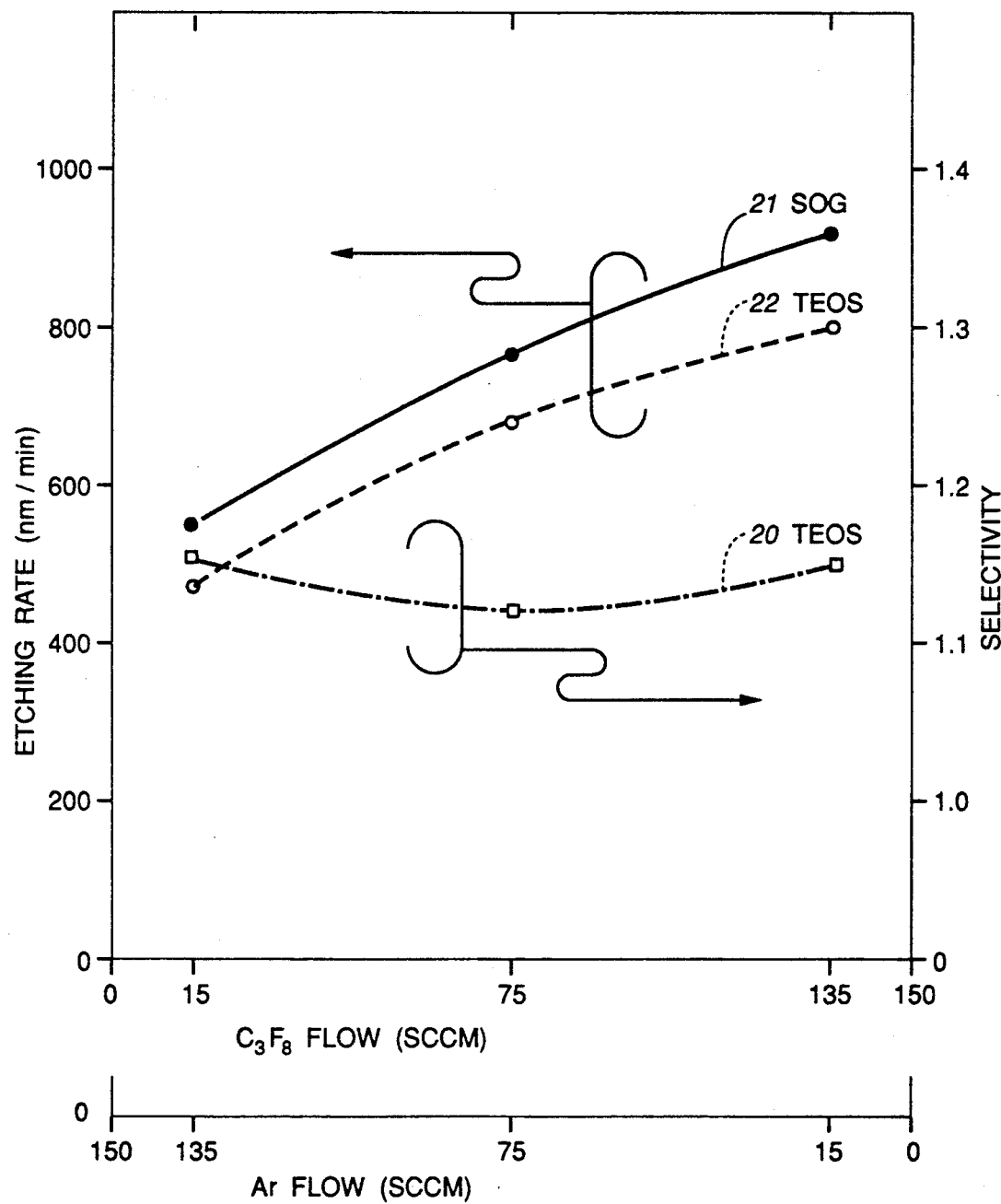
FIG._5

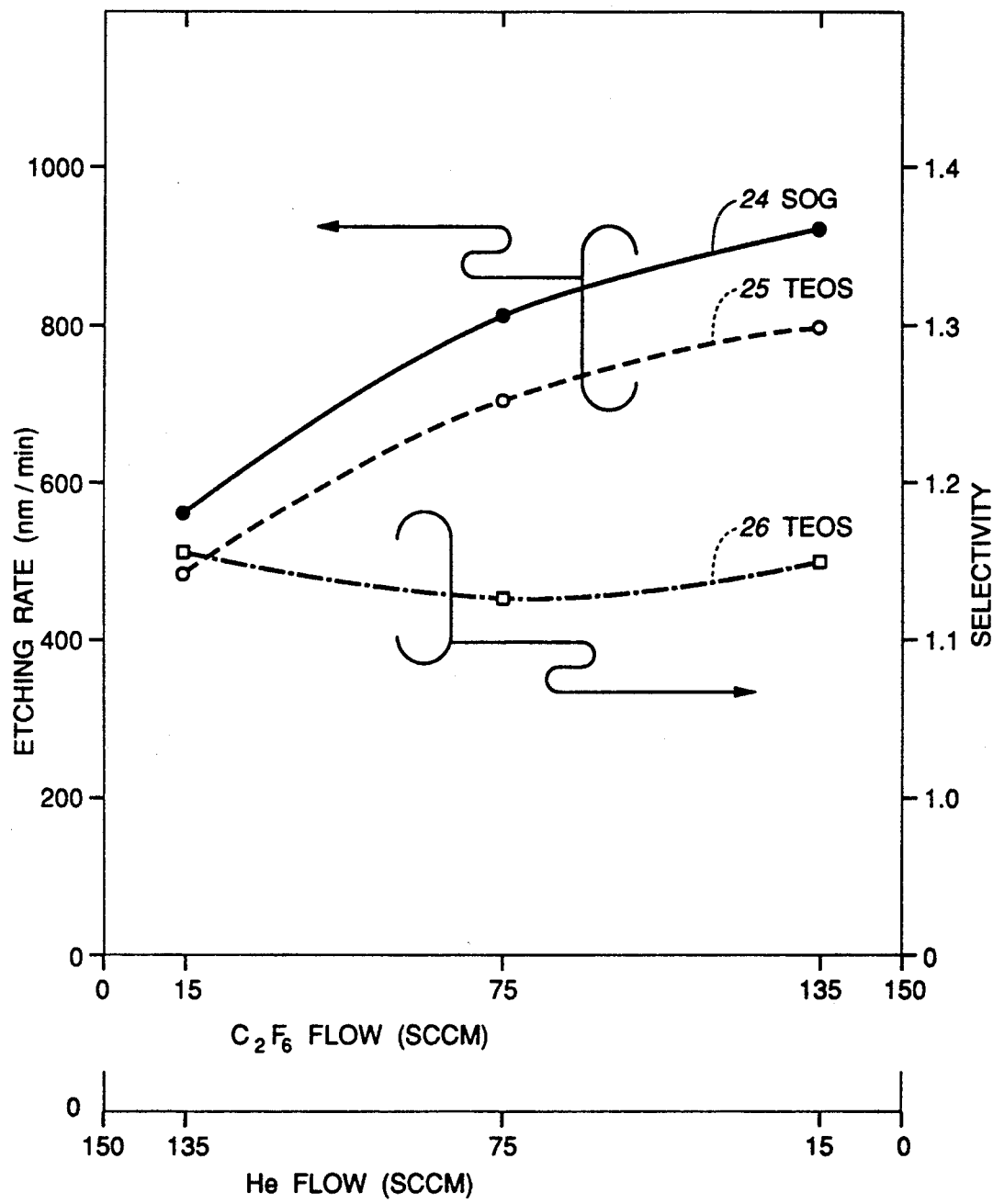
FIG._6

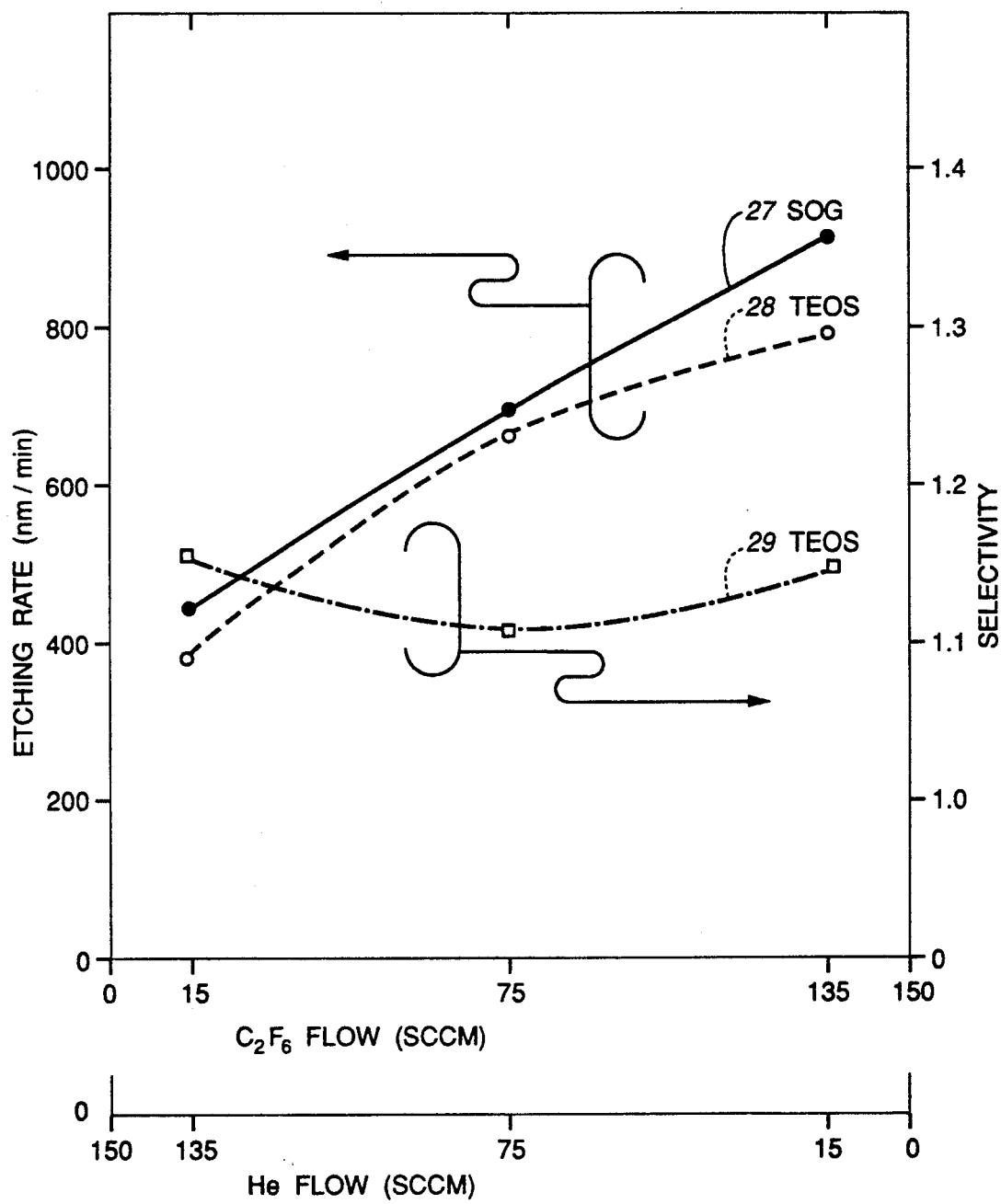
FIG._7

METHOD OF DRY ETCHING IN SEMICONDUCTOR DEVICE PROCESSING

BACKGROUND OF THE INVENTION

This invention relates to a method of dry etching in semiconductor processing and more particularly to an etch-back method of different silicon oxide layers to achieve topographical planarization.

The achievement of topographical planarization is important in forming semiconductor wafers that have two or more metal layers. In the usual case, a semiconductor structure is produced comprising layers of oxide, polysilicon, first metal wiring or conductors covered with an intermediate insulator layer. The surface of this latter layer is irregular with sharp edges and cracks, and to apply a second layer of metal, usually aluminum, on its surface is not practical because it will result in cracks or separations in the metal or incomplete metal coverage so that device yield would be significantly reduced. Thus, it is necessary to provide a method for planarizing the insulator layer so as to provide a smoother surface topography for application of the second metal layer.

FIG. 8 illustrates the conventional method for providing topographical planarization of silicon oxide layers, in particular, intermediate insulator layers which is in common practice. As shown in FIG. 8, metal wiring or conductors 2, e.g., Al, are formed by vapor deposition of a metal layer on substrate 1 followed by selective etching of the metal layer to form conductors 2. Then, oxide layer 3, i.e., $SiO_2$ layer, is formed by CVD followed by formation through thermal oxidation of SOG layer 4 which fills the gaps and indentations formed by first oxide layer 3 over conductors 2. As illustrated in FIG. 8, the surface of SOG layer 4 is irregular. The present practice is to subject the combination layers 3 and 4 to a dry or plasma etch-back process by sputtering or ion milling to reduce the thickness of these layers to the level indicated by dotted line 5 so that a more planarized surface and contour is achieved. The process employed is a physical etching procedure wherein ion milling of the insulator film surfaces is accomplished in a reactive ion etching system employing an inert gas, such as, Ar. The selectivity of the second silicon oxide layer 4 (SOG) with respect to the first silicon layer 3 ($SiO_2$) is about 1.18. The etch-back process chosen should be selected to closely match as best as possible the etch rate for SOG layer 4 and $SiO_2$ layer 3. Ideally, such a selectivity ratio should be 1.0:1.0 but this is in practice not generally possible. In any case, a selectivity ratio in the range of 0.8–1.7:1.0 is acceptable. Further, the thicker the SOG layer 4, the more enhancement in the planarization that can be achieved but with correspondingly longer period of time required for the etch-back process.

The employment of ion milling methods utilizing heavy inert Ar ions impact the surface of layers 3,4 to physically remove molecular materials from the surface. The etching rates achieved are relatively low, such as, for example, several tens of nm/min. so that the etch-back process can be comparatively quite long. This can be considerably too long in the case of employing a thick SOG layer 4.

Further, the employment of ion milling or other such physical etching method results in damage to the semiconductor structure due to the physical ion bombardment. The resulting effect is an increase in threshold voltages for formed transistors.

Also, the $SiO_2$ molecules removed from the surface adhere to the plasma system electrode and results with the re-adherence of $SiO_2$ particles on the surface being etch resulting in lower device yield. This particular problem becomes more pronounced as SOG layer 4 is deposited with increasing thickness.

It is also known to use a plasma etch comprising flourocarbon gases wherein a primary etching gas, such as, $C_2F_6$, is employed in combination with a secondary gas, such as, $CHF_3$ or $O_2$, to control the selectivity of the etch. Such a system provides for a chemical etching rather than a physical etching to etch-back silicon oxide. Also, an inert gas may be employed as a carrier gas. These plasmas contain active fluorine species and the addition of $O_2$ enhances the effectiveness of the plasma because $O_2$ helps to inhibit the recombination between fluoride radicals, F*, and thereby increases their concentration. The inert gas employed in these etching environments, such as, helium or argon, is employed as a carrier gas and to control the temperature during the etching process. See, for example, U.S. Pat. No. 4,676,867. However, the continuing problem with these flourocarbon etching systems is the lack of repeatable control over the rate and uniformity of etching. It is very difficult to etch different $SiO_2$ films by means of chemical etching. In particular, such chemical etching of a SOG layer is generally about 3 to 5 times higher than a thermal oxide layer. However, in the manufacturing step utilizing the etch-back of a combination of these oxide layers, it is necessary that the etching rate of both such layers be approximately the same, i.e., as close as possible to 1.0/1.0.

Thus, what is needed is a better means of controlling the rate of chemical etching when employing a flourocarbon reactive ion etching system wherein the rate of etching can be controlled in a practical, repeatable manner achieving optimized selectivity.

Thus, it is a principal object of this invention to provide a method of dry etching having a high etching rate with a relatively low selectivity ratio providing for a reduced etching time with high reliability and repeatability to provide a corresponding improved yield rate in the production of semiconductor devices.

SUMMARY OF THE INVENTION

According to this invention, a dry chemical etching medium for use in a reactive ion etching system for dry etching silicon oxide, such as, SOG, TEOS or LTO layers, comprises a gas mixture of a carbon fluoride gas, represented by a general formula $C_nF_{2n+2}$, wherein n is an integer, such as, $CF_4$, $C_2F_6$ or $C_3F_8$, and an inert gas, such as, He, Ar or Xe. In particular, the method of this invention places high reliance on the development and use of fluorine radicals, F*, in the plasma which are thoroughly mixed with an inert gas, e.g., He, Ar or Xe. I have discovered that the inert gas as properly mixed with the fluoride gas forms a molecular cushion at the etching surface having a buffering effect on the application of fluorine radicals, F*, liberated in the plasma and applied to the etching surface, so that control over the uniformity and rate of etching can more easily be accomplished without fear of nonuniform etching or overetching.

The application of this invention has particular application for etch-back of first and second silicon oxide layers, such as, a SOG layer and a TEOS or LTO layer.

In the preferred form of the method, four parameters are considered wherein RF power is in the range of 400 W–800 W, gas flow rate is within the range of 1:100–30:1, total gas flow is within the range of 100 sccm–250 sccm and the pressure of the system is 200 mTorr–300 mTorr.

Since the etching rate of the chemical etching method of this invention is more than ten times greater than that of the physical etching method in conventional sputter etching or ion milling, the applied etching process may be accomplished in a shorter period of time. In addition, a low selectivity ratio substantially the same as that achieved in conventional etching methods is realizable with respect to differently deposited silicon oxide layers. Thus, the application of the method of dry etching of this invention to the process of planarization of silicon oxide layers, a shorter time for a required etch-back process can be achieved. Thus, in cases where it is desirable to provide a second silicon oxide layer to be applied over a first silicon oxide layer wherein the former layer is provided with a much larger thickness than the latter to improve the level of planarization, it is possible with the method of this invention to achieve completion of the etch-back in shorter period of time or in a time period not greater than in the case where the second layer is thinner and conventional sputter etching or ion milling is utilized for etch-back.

Furthermore, since a chemical etching process is being utilized, problems encountered in physical etching processes, because of degradation of the oxide layer quality and adverse effects on transistor characteristics, such as, transistor thresholds, can be avoided. Lastly, since the product of chemical etching reaction is volatile, readherence of etched silicon particles to the wafer surface does not occur so that an improvement in device yield can be achieved.

Other objects and attainments together with a fuller understanding of the invention will become apparent and appreciated by referring to the following description and claims taken in conjunction with the accompanying drawings.

BRIEF DESCRIPTION OF THE DRAWINGS

FIG. 1 is a cross-sectional view of a wafer having first and second oxide layers relative to the application of the method of this invention to achieve planarization.

FIG. 2 is a graphic diagram illustrating the relationship between etching rate and selectivity ratio when varying the mixing ratio of hexafluoroethane gas ($C_2F_6$) and Ar gas in a reactive ion etching according to a first example of the method of this invention to the wafer shown in FIG. 1.

FIG. 3 is a graphic diagram illustrating etching rate and etching uniformity versus changes in RF power with respect to a thermal oxidation layer $SiO_2$.

FIG. 4 is a graphic diagram illustrating the relationship between etching rate and selectivity ratio when varying the mixing ratio of tetrafluoromethane gas ($CF_4$) and Ar gas in a reactive ion etching according to a second example of the method of this invention to the wafer example shown in FIG. 1.

FIG. 5 is a graphic diagram illustrating the relationship between etching rate and selectivity ratio when varying the mixing ratio of octafluoropropane gas ($C_3F_8$) and Ar gas in a reactive ion etching according to a third example of the method of this invention to the wafer example shown in FIG. 1.

FIG. 6 is a graphic diagram illustrating the relationship between etching rate and selectivity ratio when varying the mixing ratio of hexafluoroethane gas ($C_2F_6$) and He gas in a reactive ion etching according to a fourth example of the method of this invention to the wafer shown in FIG. 1.

FIG. 7 is a graphic diagram illustrating the relationship between etching rate and selectivity ratio when varying the mixing ratio of hexafluoroethane gas ($C_2F_6$) and Xe gas in a reactive ion etching according to a fifth example of the method of this invention to the wafer shown in FIG. 1.

FIG. 8 is a cross-sectional view of a wafer having first and second oxide layers relative to the conventional application of the method of achieving planarization as utilized in the prior art.

DESCRIPTION OF THE PREFERRED EMBODIMENTS

Reference is now made to FIG. 1 illustrating a typical semiconductor wafer in processing comprising the first metal layer and first and second oxide layers. A pattern of aluminum wiring or conductors 2 are formed in a conventional manner, e.g., vapor deposition and selective etching, on the surface of silicon substrate 1. This is followed by the deposition of $SiO_2$ layer 3, comprising a first silicon oxide layer, which may be formed by CVD method or thermal oxidation over aluminum wiring 2. Next, SOG (spin-on glass) layer 4 is applied by a conventional spinner, comprising a second silicon oxide layer, onto $SiO_2$ layer 3. As illustrated in FIG. 1, the surface has an irregularity caused by the formation of Al wiring 2. In order to achieve a much planar surface, layers 3 and 4 are etched back to a level indicated by dotted line 5. The etch-back method according to this invention, however, is a chemical etching comprising a gas mixture comprising a carbon fluoride gas ($C_nF_{2n+2}$) and an inert gas, e.g., He, Ar or Xe.

Since a carbon fluoride gas ($C_nF_{2n+2}$) is employed, fluorine radicals, F*, are generated in the plasma so that etching proceeds by the following reaction with respect to first and second silicon oxide layers 3 and 4:

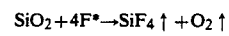

$$SiO_2 + 4F^* \rightarrow SiF_4 \uparrow + O_2 \uparrow$$

Even though a chemical etching process is involved, a high etching rate is achieved, but a low selectivity value close to 1 is achieved as the ratio of etching rate (selectivity) for different types of silicon oxide layers. The result is that a faster etching rate can be realized which is controlled so as not provide over-etching or irregular etching results. This is primarily due to the mixture of an inert gas in defined quantity with the carbon fluoride gas.

Although the exact mechanism that brings about this uniformity and ease of controllability over the etching process is not readily understood, it is believed that inert gas atoms in the plasma are caused to adhere to or be present at the etching surface that bring about a controlled rate of chemical etching at the etching surface. It is theorized that fluorine radicals, F*, are buffered by Ar molecules at or on the etching surface of layer 4 thereby functioning as "shock absorbers" or a molecular cushion against the direct action of the fluorine radicals on the silicon oxide surface. As a result, it is possible to prevent degradation in the quality of devices formed on a semiconductor wafer due to structural damage due to etching since the etching process of this invention provides no physical damage to the quality of layers 3 and 4. Moreover, since the etching reaction produces a volatile compound, $SiO_4$, there are no Si or $SiO_2$ particles dislodged from the etching surface that have to be to contended with, i.e., that have to be removed from the system chamber or redeposit on the etching surface. Thus, the etched surface remains at all times clear of etched solid silicon or silicon oxide particles resulting in a clean silicon oxide layer thereby improving yields of IC devices formed from the semiconductor wafer.

For the particular etch-back application suggested herein, etching is generally carried out over a predetermined time depending upon the etching rate determined by such parameters, such as, the gas mixing ratio and RF power. However, in applications of the etching method of this invention, other methods known in the art relating end point detection may be utilized.

The following several examples illustrate the method of this invention without intending to limit the practice of the invention to the particular examples illustrated.

EXAMPLE 1

In a first example, argon gas was added in a reactive ion etching system, such as, a DryTek 384 system, employing hexafluoroethane gas ($C_2F_6$) mixed with the inert gas, Ar. FIG. 2 is a graphic illustration showing the relationship between etching rate and selection ratio for various types of silicon oxide layers, to wit, SOG, TEOS (tetra-ethoxyortho-silicate), and LTO (low temperature thermal oxidation $SiO_2$) layers, while varying the mixing or flow ratio of hexafluoroethane gas ($C_2F_6$) and Ar gas in the etching system. The etching rate is illustrated along the left side of the graph while selectivity (ratio) is illustrated along the right side of the graph for SOG layer 11, TEOS layer 12 and LTO layer 13. These particular layers are intended as representative examples of particular types of silicon oxide layers, as the method of this invention may also be applied to other kinds of formed silicon oxide layers. The etching conditions applied relative to this example were as follows: the pressure of the system was 200 mTorr, the applied RF power was 800 W, the total flow per unit volume of the $C_2F_6$/Ar gas mixture was 150 sccm and the applied etching time was set at 10 seconds. As illustrated in FIG. 2, the curve characteristics for layers 11, 12 and 13 have the same feature but the etching rate for the SOG layer is characteristically greater than for the TEOS and LTO layers. Even though the etching rate is reduced with an increase in the Ar gas in the mixing ratio, the etching rate is characteristically several hundreds of nm/min, e.g., 400 nm/min. to 1,000 nm/min. This is more than ten times greater than the etching rate achievable from conventional sputter etching or ion milling employing AR gas.

In FIG. 2, the selectivity (ratio) for TEOS layer 14 and LTO layer 15 are also illustrated. It can be seen that the selectivity for TEOS layer 14 and LTO layer 15 are close to each other, falling within the range of 1.12-1.17. When the mixing ratio of $C_2F_6$/Ar is 50%, both of the selection ratios were about 1.12, selectivity is respectively about 1.12 and 1.17. Such selectivity value is quite suitable for the planarization process and is by no means inferior to the selection ratio obtainable with respect to conventional planarization techniques employing Ar sputtering or ion milling, which is about 1.17 or 1.18.

The graphic illustration of FIG. 3 illustrates data relative to the etching rate and surface uniformity achieved relative to a $SiO_2$ layer formed by thermal oxidation while varying the the applied RF power to the system. The other conditions of the system were a pressure of 200 mTorr, an applied etching time of 17 seconds, and a flow mixture containing 15 sccm of hexafluoroethane gas ($C_2F_6$) and 135 sccm of Ar gas. The results as indicated by line 17 show that the etching rate increases with an increase in RF power. Further, as indicated by line 16, % uniformity of the etched surface gradually improves with an increase in RF power. Per cent uniformity in the case here can be generally defined as the variation of the amount of etching or etching rate across a semiconductor wafer utilized as a test sample. This can be defined as the differential between the slowest and fastest etching rate or the differential etching rate, as the etchant rate varies relative to different portions across the wafer during the application of the etching process. The greater the differential, the higher the % uniformity. Thus, in FIG. 3, 0% uniformity would mean no nonuniformity exists on the wafer surface after etching. The higher the % uniformity, the greater the nonuniformity across the wafer. In the test sample, no photo resist is employed so that the etchant is exposed to all portions of the wafer. Thus, % uniformity is calculated as follows:

$$(X_{MAX}-X_{MIN}/X_{MAX}+X_{MIN}) \cdot 100 \, (\%)$$

wherein $X_{MAX}$ is the fastest etching rate on the wafer and $X_{MIN}$ is the slowest etching rate on the wafer.

$X_{MAX}$ and $X_{MIN}$ can be established in two ways. The first method is an examination of the light intensity reflected from the wafer surface after application of the etchback method of this invention. The light reflected from the brightest regions of the wafer will be regions of the fastest etching rate. The light reflected from the darkest regions of the wafer will be regions of the slowest etching rate. Accordingly, $X_{MAX}$ and $X_{MIN}$ can be determined from these regions. The second method of determining $X_{MAX}$ and $X_{MIN}$ is by measurement of etching rates at radial points from the center of the wafer. Generally, it has been found that the etching rate at the same radial points from the center of the wafer turn out to be the same. Thus, $X_{MAX}$ and $X_{MIN}$ can be determined based upon measurements performed at different radial regions of the wafer.

As a variation of the foregoing example, a sample such as that disclosed in FIG. 1 was employed comprising a $SiO_2$ layer 3, having a thickness of 600 nm, was formed by thermal oxidation on vapor deposited aluminum wiring 2 formed on silicon substrate 1. Next, a SOG layer having a thickness of 70 nm, was deposited over $SiO_2$ layer 3 by spin-on application. Next, an etchback was performed in a reactive ion etching system for a period of about 18 seconds utilizing an RF power of 800 W and a $C_2F_6$/Ar gas mixture comprising 15 sccm of $C_2F_6$ and 135 sccm of Ar. The system pressure was about 200 mTorr. The etching rate is about 457 nm/min. The resultant etch-back was to a depth of 150 nm and selectivity was about 1.1. The applied etching time to achieve planarization was reduced by about 10% compared to the case employing conventional sputter or ion milling etching methods. Further, since a non-impact, chemical type etching process is being utilized, adverse effects on layer quality and degradation in transistor characteristics, such as, threshold voltage, may be avoided. Also, since the product of the etching reaction is volatile, contamination caused by remaining physically removed particles does not occur and, as a result, resulting enhancement in production yields can be realized.

While the foregoing example involved etch-back of SOG/SiO$_2$ layers showing good selectivity, the etch-back of SOG/TEOS layers in some cases have not provided an improved level of selectivity in the use of the method of this invention, e.g., in some case around 1.25, vis a vis of about 1.18 for conventional methods, but this selectivity level is still useful to obtain desire degree of surface flatness, for example, surface uniformity, about 2% –6.3%, which is about ¼ to 1/10 improved over such conventional etching methods. Also, the etching rate is about 10 times faster than conventional methods.

EXAMPLE 2

The next example relates to the mixture of tetrafluoromethane gas (CF$_4$) and Ar as illustrated in FIG. 4. FIG. 4 is a graphic illustration of the relationship between etching rate and selectivity on silicon oxide layers while varying the mixing ratio between CF$_4$ and Ar in a reactive ion etching system. The silicon oxide layers treated in this example were an SOG layer and a TEOS layer. The applied conditions in the etching system were substantially the same as in the case of Example 1, i.e., the data relative to etching rate and selectivity were obtained by varying the mixing ratio (flow ratio) of CF$_4$ and Ar gas under system conditions where the gas pressure was 200 mTorr, applied RF power was 800 W, the applied etching time was 10 seconds and a total flow volume of the gas mixture was 150 sccm per unit. As shown in FIG. 4, the etching rate relative to the SOG and TEOS layer was several hundreds nm/min, e.g., in the range of 400 nm/min to 1,000 nm/min, as respectively indicated by lines 18, 19. The etching rate was reduced within this range by increasing the amount of Ar in the mixing ratio of gases. Also, as illustrated by line 20, the selectivity for the TEOS layer was within the range of 1.12–1.16 and the selectivity with 50% mixing ratio is about 1.12.

EXAMPLE 3

The next example relates to the mixture of octafluoropropane gas (C$_3$F$_8$) and Ar as illustrated in FIG. 5. FIG. 5 is a graphic illustration of the relationship between etching rate and selectivity on silicon oxide layers while varying the mixing ratio between C$_3$F$_8$ and Ar in a reactive ion etching system. The silicon oxide layers treated in this example were an SOG layer and a TEOS layer. The applied conditions in the etching system were substantially the same as in the case of Example 1, i.e., the data relative to etching rate and selectivity were obtained by varying the mixing ratio (flow ratio) of C$_3$F$_8$ and Ar gas under system conditions where the gas pressure was 200 mTorr, applied RF power was 800 W, the applied etching time was 10 seconds and a total flow volume of the gas mixture was 150 sccm per unit. As shown in FIG. 4, the etching rate relative to the SOG and TEOS layer was several hundreds nm/min, e.g., in the range of 400 nm/min to 1,000 nm/min, as respectively indicated by lines 21, 22. The etching rate was reduced within this range by increasing the amount of Ar in the mixing ratio of gases. Also, as illustrated by line 23, the selectivity for the TEOS layer was within the range of 1.12–1.16 and the selectivity with 50% mixing ratio is about 1.12.

Thus, in the case of both Examples 2 and 3, the etching rate was at substantially the same level as in the case of employing a gas mixture comprising C$_2$F$_6$ and Ar gas with the etching rate being greater than ten times the etching rate of conventional Ar sputtering or ion milling etching. Further, the selectivity value was also at the same level as the selectivity level in the case of C$_2$F$_6$/Ar gas mixture, which is not inferior to the selectivity of about 1.18 achieved in conventional Ar sputtering or ion milling etching.

EXAMPLE 4

The next example relates to the mixture of hexafluoroethane gas (C$_2$F$_6$) and He as illustrated in FIG. 6. FIG. 6 is a graphic illustration of the relationship between etching rate and selectivity on silicon oxide layers while varying the mixing ratio between CF$_4$ and Ar in a reactive ion etching system. The silicon oxide layers treated in this example were an SOG layer and a TEOS layer. The applied conditions in the etching system were substantially the same as in the case of Example 1, i.e., the data relative to etching rate and selectivity were obtained by varying the mixing ratio (flow ratio) of C$_2$F$_6$ and He gas under system conditions where the gas pressure was 200 mTorr, applied RF power was 800 W, the applied etching time was 10 seconds and a total flow volume of the gas mixture was 150 sccm per unit. As shown in FIG. 6, the etching rate relative to the SOG and TEOS layer was several hundreds nm/min, e.g., in the range of 400 nm/min to 1,000 nm/min, as respectively indicated by lines 24, 25. The etching rate was reduced within this range by increasing the amount of He in the mixing ratio of gases. Also, as illustrated by line 26, the selectivity for the TEOS layer was within the range of 1.12–1.16 and the selectivity with 50% mixing ratio is about 1.12.

EXAMPLE 5

The next example relates to the mixture of hexafluoroethane gas (C$_2$F$_6$) and Xe as illustrated in FIG. 6. FIG. 6 is a graphic illustration of the relationship between etching rate and selectivity on silicon oxide layers while varying the mixing ratio between CF$_4$ and Ar in a reactive ion etching system. The silicon oxide layers treated in this example were an SOG layer and a TEOS layer. The applied conditions in the etching system were substantially the same as in the case of Example 1, i.e., the data relative to etching rate and selectivity were obtained by varying the mixing ratio (flow ratio) of C$_2$F$_6$ and Xe gas under system conditions where the gas pressure was 200 mTorr, applied RF power was 800 W, the applied etching time was 10 seconds and a total flow volume of the gas mixture was 150 sccm per unit. As shown in FIG. 7, the etching rate relative to the SOG and TEOS layer was several hundreds nm/min, e.g., in the range of 400 nm/min to 1,000 nm/min, as respectively indicated by lines 27, 28. The etching rate was reduced within this range by increasing the amount of Xe in the mixing ratio of gases. Also, as illustrated by line 29, the selectivity for the TEOS layer was within the range of 1.12–1.16 and the selectivity with 50% mixing ratio is about 1.12.

Thus, in the case of both Examples 4 and 5 wherein C$_2$F$_6$/He and C$_2$F$_6$/Xe were respectively employed, the etching rate was at substantially the same level as in the case of employing a gas mixture comprising C$_2$F$_6$ and Ar gas with the etching rate being greater than ten times the etching rate of conventional Ar sputtering or ion milling etching. Further, the selectivity value was also at the same level as the selectivity level in the case of $C_2F_6$/Ar gas mixture, which is not inferior to the selectivity of about 1.18 achieved in conventional Ar sputtering or ion milling etching.

Accordingly, when employing the method of dry chemical etching comprising this invention to perform an etch-back of one or more oxide layers for purpose of accomplishing planarization in the manner illustrated in FIG. 1, a significant decrease in etch-back time can be achieved wherein the rate and improved uniformity of the etch can be realized with a resultant increase in wafer throughput and yield over that previously obtainable with conventional physical and chemical etching methods.

While the byproduct of the chemical etching reaction is volatile, the chamber does become contaminated over time with the byproduct, e.g., polymer, which may be removed from the chamber walls and electrodes of the reactive ion system by means of a dry cleaning process utilizing an $O_2$ plasma. The preferred conditions for such a cleaning process is an RF power of about 800 watts, a flow rate of $O_2$ of about 200 sccm, and a system pressure of 3,000 mTorr. Employing these parameters, the system chamber may be clean of all polymer in about 2 minutes.

While the invention has been described in conjunction with several specific embodiments, it is evident to those skilled in the art that many further alternatives, modifications and variations will be apparent in light of the foregoing description. For example, a similar effect may be achieved when the method of this invention is employed with other kinds of silicon oxide layers or when the method of this invention is employed with other kinds of fluoride gases or inert gases or employed with different combinations of one or more fluoride gases mixed with one or more different inert gases. Further, beside the employment of this invention to the planarization of a multilayer interconnection semiconductor structure, the method of this invention may also be applied to a trench etching process with a low selectivity, such as in the case of groove filling procedure of a trench wherein two or more types of silicon oxide layers are involved in the procedure. Thus, the invention described herein is intended to embrace all such alternatives, modifications, applications and variations as may fall within the spirit and scope of the appended claims.

What is claimed is:

1. A method of producing a semiconductor device including a step for simultaneously dry etching first and second deposited silicon oxide layers of different types comprising the steps of providing an etching gas mixture absent of an inhibitor such as oxygen comprising a carbon flouride gas, $C_nF_{2n+2}$, wherein n is an integer, and an inert gas, creating a plasma wherein fluorine radicals, F*, are liberated in the plasma, applying the fluorine radicals, F*, to an etching surface of said first and second deposited silicon oxide layers, supplying a volume of inert gas in the created plasma of fluorine radicals, F*, so that a buffering effect is created on the application of the fluorine radicals, F*, to the etching surface enhancing the etching rate while maintaining etching uniformity.

2. The method of claim 1 wherein said inert gas comprises one or more gases selected from the group consisting of He, Ar and Xe.

3. A method of producing a semiconductor device employing an etch-back planarization step comprising:

applying a first insulating layer over a metal layer, applying a second SOG layer over said first layer, utilizing an etching gas mixture absent of an inhibitor such as oxygen comprising a carbon fluoride gas, $C_nF_{2n+2}$, wherein n is an integer, and an inert gas, creating a plasma wherein fluorine radicals, F*, are liberated in the plasma, applying the fluorine radicals, F*, to an etching surface of said first and second layers to a predetermined depth to form a more planarized surface, supplying a volume of inert gas in the created plasma of fluorine radicals, F*, so that a buffering effect is created on the application of the fluorine radicals, F*, to the etching surface enhancing the etching rate while maintaining etching uniformity.

4. The method of claim 3 wherein said inert gas comprises one or more gases selected from group consisting of He, Ar and Xe.

5. A method of producing a semiconductor wafer which includes the planarization of a surface of the semiconductor wafer during the practice of the method comprising the steps of:

providing reactive ion etching system employing a gas medium absent of an inhibitor such as oxygen comprising a mixture of a carbon fluoride gas, $C_nF_{2n+2}$, wherein n is an integer, and an inert gas, said gas mixture comprising a gas mixture ratio of carbon fluoride gas/inert gas in the range between about 10%/90% to 90%/10%, placing the semiconductor wafer in a plasma generated by the system including a high volume of fluorine radicals, F*, etching a surface of the semiconductor wafer with the application of the flourine radicals, F*, to the surface, and buffering the application of generated radicals, F*, applied to the etching surface by providing a volume of inert gas in the created plasma of fluorine radicals, F*, sufficient to provide a molecular cushioning affect at the etching surface against direct application of the created plasma of fluorine radicals, F*, to the etching surface.

6. The method of claim 5 wherein said gas medium is selected from the group consisting of $CF_4$, $C_2F_6$, $C_3F_8$, Ar, He and Xe.

7. The method of claim 5 wherein the etching rate is in the range of 400 nm/min to 1,000 nm/min and the selectivity is in the range of 1.12–1.16.

8. The method of claim 5 including the step of cleaning the system of contaminants employing an $O_2$ plasma for a period of about 2 minutes.

9. A method of producing a semiconductor device which includes the planarization of a surface of the semiconductor wafer during the practice of the method, comprising the steps of:

providing a reactive ion etching system employing a gas medium absent of an inhibitor such as oxygen comprising a mixture of a carbon fluoride gas, $C_nF_{2n+2}$, wherein n is an integer, and an inert gas and wherein the applied RF power is in the range of 400 W to 800 W, the the range of 1:100 to 30:1, the total gas flow is in the range of 100 sccm to 200 sccm and the system pressure is in the range of 200 mTorr to 300 mTorr producing a plasma having a high volume of fluorine radicals, F*, placing the semiconductor wafer in the plasma generated by the system, and etching away the semiconductor surface wherein inert gas molecules at the etching surface buffer the application of the generated radicals, F*, to the etching surface.

10. The method of claim 9 wherein said gas medium is selected from the group consisting of $CF_4$, $C_2F_6$, $C_3F_8$, Ar, He and Xe.

* * * * *